(12) United States Patent
Lee

(10) Patent No.: US 9,153,629 B2
(45) Date of Patent: Oct. 6, 2015

(54) IN-CELL OLED TOUCH DISPLAY PANEL STRUCTURE OF NARROW BORDER

(71) Applicant: SuperC-Touch Corporation, New Taipei (TW)

(72) Inventor: Hsiang-Yu Lee, New Taipei (TW)

(73) Assignee: SUPERC-TOUCH CORPORATION, New Taipei (TW)

( * ) Notice: Subject to any disclaimer, the term of this patent is extended or adjusted under 35 U.S.C. 154(b) by 0 days.

(21) Appl. No.: 14/455,697

(22) Filed: Aug. 8, 2014

(65) Prior Publication Data

US 2015/0048346 A1    Feb. 19, 2015

(30) Foreign Application Priority Data

Aug. 16, 2013  (TW) .............................. 102215428 U

(51) Int. Cl.
| | |
|---|---|
| *H01L 29/18* | (2006.01) |
| *H01L 29/08* | (2006.01) |
| *H01L 35/24* | (2006.01) |
| *H01L 51/00* | (2006.01) |
| *H01L 27/32* | (2006.01) |
| *G06F 3/041* | (2006.01) |

(52) U.S. Cl.
CPC .............. *H01L 27/323* (2013.01); *G06F 3/041* (2013.01); *H01L 27/3248* (2013.01)

(58) Field of Classification Search
CPC ...... H01L 27/323; G06F 3/041; G06F 3/0412
USPC ................ 257/40, 59, 88, E27.111, E27.132; 345/173, 174
See application file for complete search history.

(56) References Cited

U.S. PATENT DOCUMENTS

| | | | |
|---|---|---|---|
| 7,196,281 B2 * | 3/2007 | Cok et al. ........................ 200/512 |
| 2010/0007632 A1 * | 1/2010 | Yamazaki ........................ 345/175 |
| 2010/0123680 A1 * | 5/2010 | Lee et al. ........................ 345/174 |
| 2012/0105337 A1 * | 5/2012 | Jun et al. ........................ 345/173 |
| 2013/0335365 A1 * | 12/2013 | Kim et al. ........................ 345/174 |

\* cited by examiner

*Primary Examiner* — Mohsen Ahmadi
(74) *Attorney, Agent, or Firm* — Muncy, Geissler, Olds & Lowe, P.C.

(57) ABSTRACT

An in-cell OLED touch panel structure of narrow border includes an upper substrate, a lower substrate, an OLED layer configured between the upper and lower substrates, a black matrix layer, a first sensing electrode layer, a second sensing electrode layer, and a thin film transistor layer. The black matrix layer is composed of a plurality of opaque lines. The first sensing electrode layer includes M first conductor line units and N connection lines. The second sensing electrode layer includes N second conductor line units. Each second conductor line unit makes use of a corresponding i-th connection line to be extended to one edge of the in-cell OLED touch panel structure. The M first conductor line units, the N connection lines, and the N second conductor line units are disposed at positions corresponding to those of the plurality of opaque lines of the black matrix layer.

14 Claims, 8 Drawing Sheets

IN-CELL OLED TOUCH DISPLAY PANEL STRUCTURE OF NARROW BORDER

BACKGROUND OF THE INVENTION

1. Field of the Invention

The present invention relates to a display screen with a touch panel and, more particularly, to an in-cell OLED touch display panel structure of narrow border.

2. Description of Related Art

Modern consumer electronic apparatuses are typically equipped with touch panels for use as their input devices. According to different sensing manners, the touch panels can be classified into resistive type, capacitive type, acoustic type, and optical type.

The principle of touch panels is based on different sensing manners to detect a voltage, current, acoustic wave, or infrared to thereby detect the coordinates of touch points on a screen where a finger or other medium touches. For example, a resistive touch panel uses a potential difference between the upper and lower electrodes to compute the position of a pressed point for recognizing the touch location, and a capacitive touch panel uses a capacitance change generated in an electrostatic combination of the arranged transparent electrodes with a human body to generate a current or voltage for detecting touch coordinates.

With the widespread use of smart phones, the multi-touch technique is getting more and more important. Currently, the multi-touch is implemented by projected capacitive touch technique.

The projected capacitive touch technique makes use of two layers of indium tin oxide (ITO) to form a matrix of sensing units arranged in intersected columns and rows, so as to detect precise touch positions. The projected capacitive touch technique is based on capacitive sensing, wherein it designs plural etched ITO electrodes and adds plural sets of transparent conductor lines that are on different planes and vertical with each other to form X-axis and Y-axis driving lines. These conductor lines are all controlled by a controller for being sequentially scanned to detect capacitance changes that are sent to the controller.

FIG. 1 is a schematic diagram of a prior OLED touch display panel structure 100. On the prior OLED touch display panel structure 100, the sensing conductor lines 110, 120 are arranged in the first direction (Y-axis direction) and in the second direction (X-axis direction). When a touch sensing is being performed and the sensing conductor lines 120 have to transmit the sensed signals to the control circuit 131 on a flexible circuit board 130, a great amount of wires at the side of the panel 140 is required for connection to the flexible circuit board 130. Such a prior design increases the border width of the touch panel and thus is not suitable for the trend of narrow border.

Therefore, it is desirable to provide an improved OLED touch panel device to mitigate and/or obviate the aforementioned problems.

SUMMARY OF THE INVENTION

The object of the present invention is to provide an in-cell OLED touch panel structure of narrow border, which can significantly increase the light penetration rate of a touch panel and also can greatly save the material cost and the manufacturing cost, and which is suitable for narrow border design in comparison with the prior art.

To achieve the object, there is provided an in-cell OLED touch panel structure of narrow border, which comprises: an upper substrate; a lower substrate parallel to the upper substrate; an OLED layer configured between the upper substrate and the lower substrates; a black matrix layer arranged on one side of the upper substrate facing the OLED layer, the black matrix layer being composed of a plurality of opaque lines; a first sensing electrode layer arranged on one side of the black matrix layer facing the OLED layer and including M first conductor line units and N connection lines arranged in a first direction for touch detection, where M and N are each a positive integer; a second sensing electrode layer arranged on one side of the first sensing electrode layer facing the OLED layer and including N second conductor line units arranged in a second direction for touch detection, wherein each of the N second conductor line units makes use of a corresponding i-th connection line to be extended to one edge of the in-cell OLED touch panel structure, where i is a positive integer and $1 \le i \le N$; and a thin film transistor layer disposed at one side of the lower substrate facing the OLED layer, wherein the M first conductor line units, the N connection lines, and the N second conductor line units are disposed at positions corresponding to those of the plurality of opaque lines of the black matrix layer.

Other objects, advantages, and novel features of the invention will become more apparent from the following detailed description when taken in conjunction with the accompanying drawings.

DETAILED DESCRIPTION OF THE PREFERRED EMBODIMENT

Figure 2:
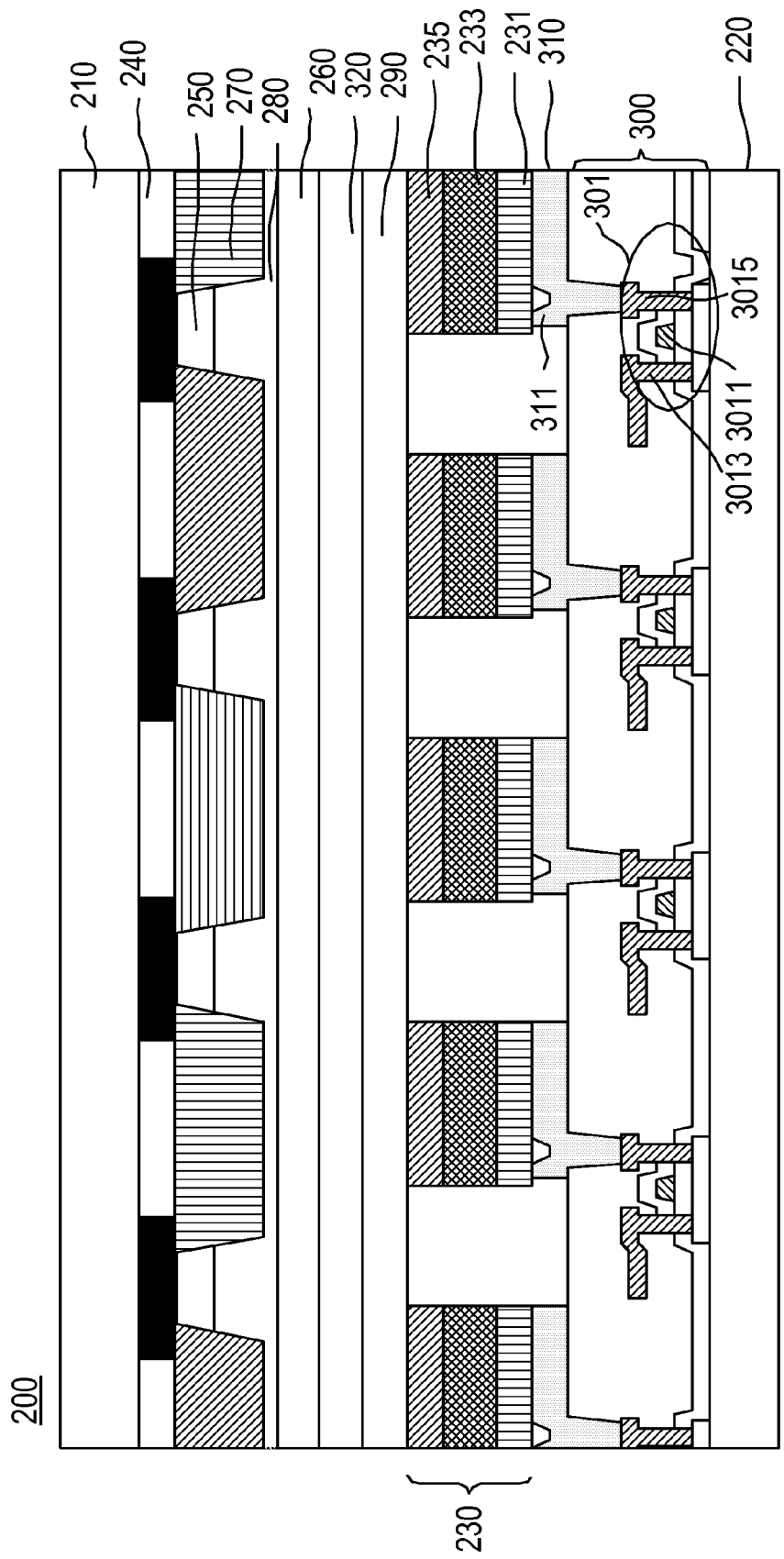
FIG. 2 is a stack diagram of an in-cell OLED touch display panel structure of narrow border in accordance with an embodiment of the present invention.

With reference to FIG. 2, there is shown a stack diagram of an in-cell OLED touch display panel structure of narrow border 200 in accordance with a preferred embodiment of the present invention. As shown, the in-cell OLED touch display panel structure of narrow border 200 includes an upper substrate 210, a lower substrate 220, an OLED layer 230, a black matrix layer 240, a first sensing electrode layer 250, a second sensing electrode layer 260, a color filter layer 270, a first insulation layer 280, a cathode layer 290, a thin film transistor (TFT) layer 300, an anode layer 310, and a second insulation layer 320.

The upper substrate 210 and the lower substrate 220 are preferably glass substrates and are parallel to each other. The OLED layer 230 is disposed between the upper and lower substrates 210, 220.

The black matrix layer 240 is between the upper substrate 210 and the OLED layer 230 and is disposed right next to the upper substrate 210. The black matrix layer 240 is composed of a plurality of opaque lines.

Figure 3:
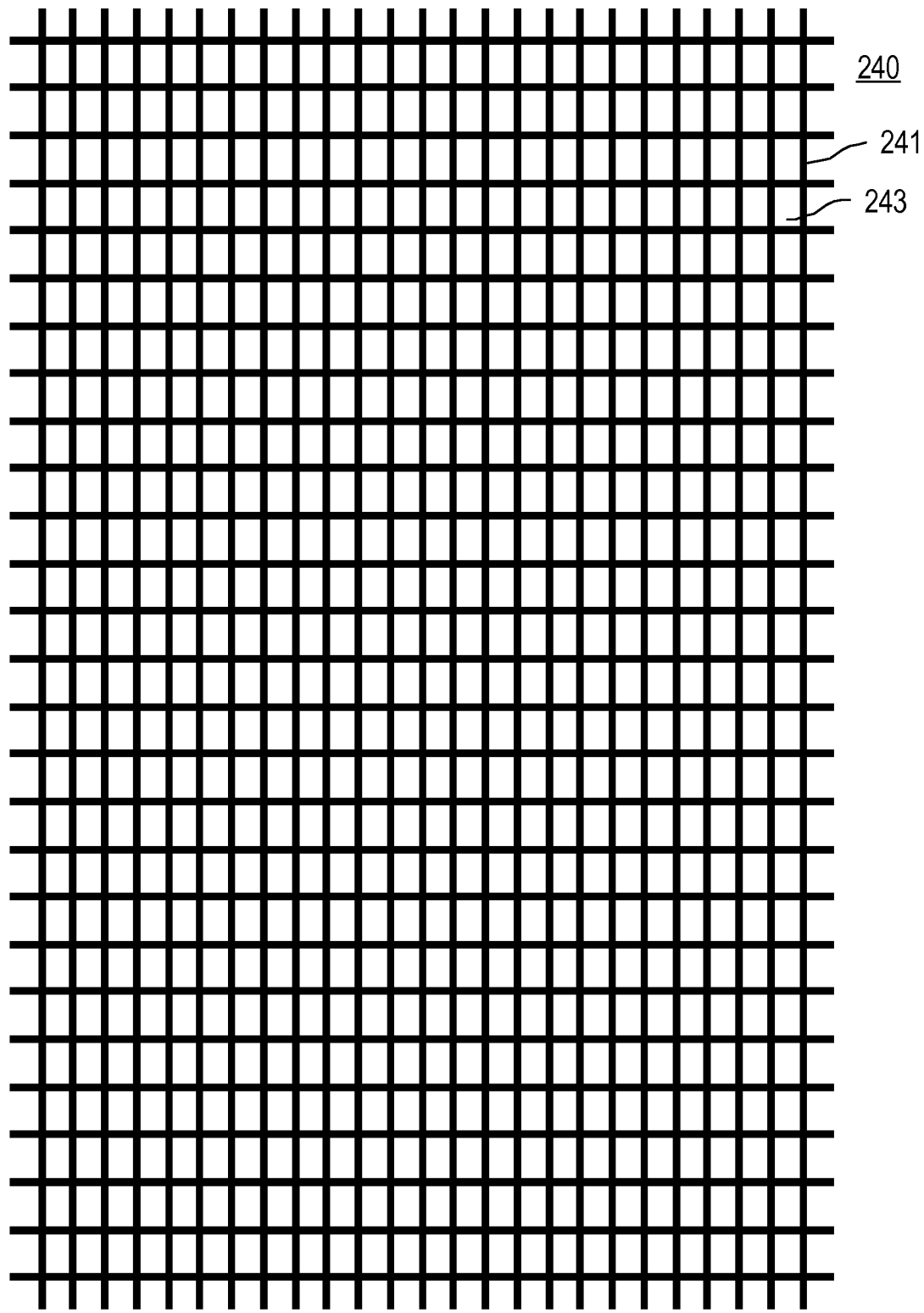
FIG. 3 schematically illustrates a black matrix layer.

FIG. 3 schematically illustrates the black matrix layer 240, which is the same as that of the known LCD device. As shown in FIG. 3, the black matrix layer 240 is composed of lines of insulating material that are black and opaque for forming the plurality of opaque lines 241. The lines of black insulating material are arranged as a checkerboard pattern, the color filter layer 270 is disposed in the areas 243 among the lines of black insulating material.

In the present invention, the first sensing electrode layer 250 and the second sensing electrode layer 260 are arranged on one side of the black matrix layer 240 that faces the OLED layer 230, and a sensing touch pattern structure is thus formed by the first sensing electrode layer 250 and the second sensing electrode layer 260.

Figure 4:
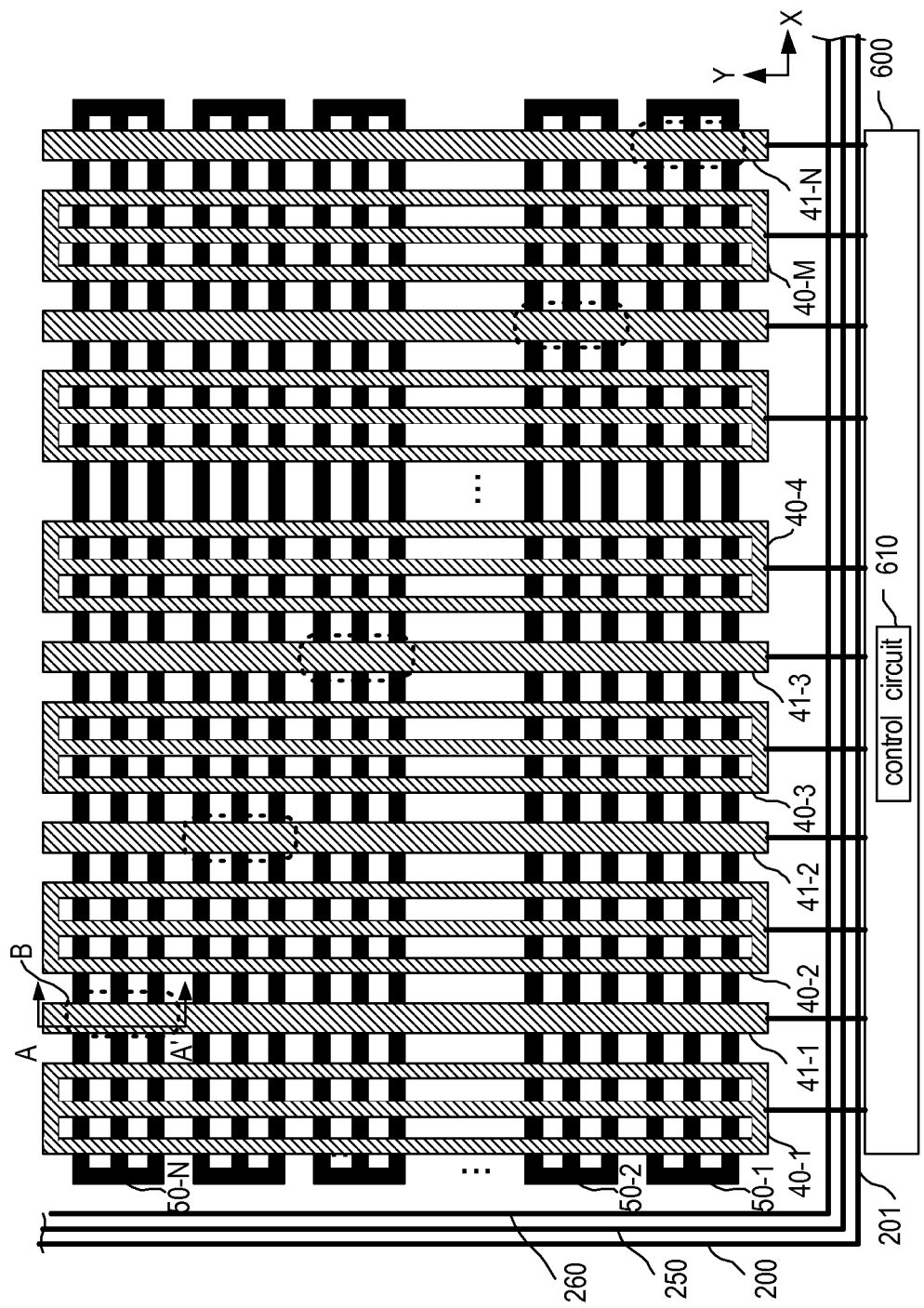
FIG. 4 is schematic diagram of an in-cell OLED touch display panel structure of narrow border according to the present invention.

The first sensing electrode layer 250 is arranged on one side of the black matrix layer 240 facing the OLED layer 230 and, with reference to FIG. 4, the first sensing electrode layer 250 includes M first conductor line units 40-1, 40-2, ..., 40-M and N connection lines 41-1, 41-2, ..., 41-N arranged in a first direction (Y-axis direction) for touch detection, where M and N are each a positive integer. The M first conductor line units 40-1, 40-2, ..., 40-M and the N connection lines 41-1, 41-2, ..., 41-N are made of conductive metal material.

The second sensing electrode layer 260 is disposed on one side of the first sensing electrode layer 250 facing the OLED layer 230 and, with reference to FIG. 4, the second sensing electrode layer 260 includes N second conductor line units 50-1, 50-2, ..., 50-N arranged in a second direction (X-axis direction). When performing touch sensing and receiving touch driving signals, each of the N second conductor line units 50-1, 50-2, ..., 50-N makes use of a corresponding i-th connection line (41-1, 41-2, ..., 41-N) to be extended to one edge 201 of the in-cell OLED touch display panel structure 200, where i is a positive integer and 1≤i≤N. The first direction is substantially perpendicular to the second direction. The M first conductor line units 40-1, 40-2, ..., 40-M, the N connection lines 41-1, 41-2, ..., 41-N, and the N second conductor line units 50-1, 50-2, ..., 50-N are disposed at positions corresponding to the positions of the plurality of opaque lines 241 of the black matrix layer 240.

As shown in FIG. 4, which is a schematic diagram of an in-cell OLED touch display panel structure of narrow border in accordance with the present invention, each of the M first conductor line units 40-1, 40-2, ..., 40-M is composed of plural metal sensing lines, for example three metal sensing lines in this embodiment, and each of the N second conductor line units 50-1, 50-2, ..., 50-N is composed of plural metal sensing lines, for example three metal sensing lines in this embodiment. The M first conductor line units 40-1, 40-2, ..., 40-M and the N second conductor line units 50-1, 50-2, ..., 50-N are not electrically connected with each other. Preferably, an insulation layer 280 is arranged between the first sensing electrode layer 250 and the second sensing electrode layer 260. Alternatively, it is also applicable to arrange insulation traces or insulation blocks in-between the intersections of the M first conductor line units 40-1, 40-2, ..., 40-M and the N second conductor line units 50-1, 50-2, ..., 50-N.

The plural metal sensing lines of each of the M first conductor line units 40-1, 40-2, ..., 40-M form a quadrilateral region, and the plural metal sensing lines of each of the N second conductor line units 50-1, 50-2, ..., 50-N also form a quadrilateral region. The metal sensing lines in each quadrilateral region are electrically connected together, while any two of the quadrilateral regions are not connected with each other. The quadrilateral region has a shape of rectangle or square.

Each of the N connection lines 41-1, 41-2, ..., 41-N is disposed between two first conductor line units (40-1, 40-2, ..., 40-M).

The plural metal sensing lines in each quadrilateral region formed by the plural metal sensing lines of each of the M first conductor line units 40-1, 40-2, ..., 40-M and the N second conductor line units 50-1, 50-2, ..., 50-N are made of conductive metal material or alloy material. The conductive metal material is selectively to be chromium, barium, aluminum, silver, copper, titanium, nickel, tantalum, cobalt, tungsten, magnesium, calcium, potassium, lithium, indium, their alloy or a mixture of LiF, MgF2 or Li2O.

As shown in FIG. 4, each of the N second conductor line units 50-1, 50-2, ..., 50-N is electrically connected with a corresponding connection line (41-1, 41-2, ..., 41-N) at a position denoted by a dotted ellipse, and each of the N connection lines 41-1, 41-2, ..., 41-N is extended to the same edge 201 of the in-cell OLED touch display panel structure 200 through a corresponding metal wire for being further connected to the flexible circuit board 600. Each of the M first conductor line units 40-1, 40-2, ..., 40-M is extended to the same edge 201 of the in-cell OLED touch display panel structure 200 through a corresponding metal wire for being further connected to the flexible circuit board 600.

The surface of the in-cell OLED touch display panel structure 200 is provided to receive at least one touch point. There is further provided with a control circuit 610 which is electrically connected to the M first conductor line units 40-1, 40-2, ..., 40-M and the N second conductor line units 50-1, 50-2, ..., 50-N via the flexible circuit board 600.

The M first conductor line units 40-1, 40-2, ..., 40-M and the N second conductor line units 50-1, 50-2, ..., 50-N correspondingly generate a sensing signal in response to the position and magnitude of a finger's touch on at least one touch point of the in-cell OLED touch display panel structure 200. The control circuit 610 is electrically connected to the M first conductor line units 40-1, 40-2, ..., 40-M and the N second conductor line units 50-1, 50-2, ..., 50-N via the flexible circuit board 600, so as to calculate the coordinate of the at least one touch point based on the sensing signal.

Figure 5:
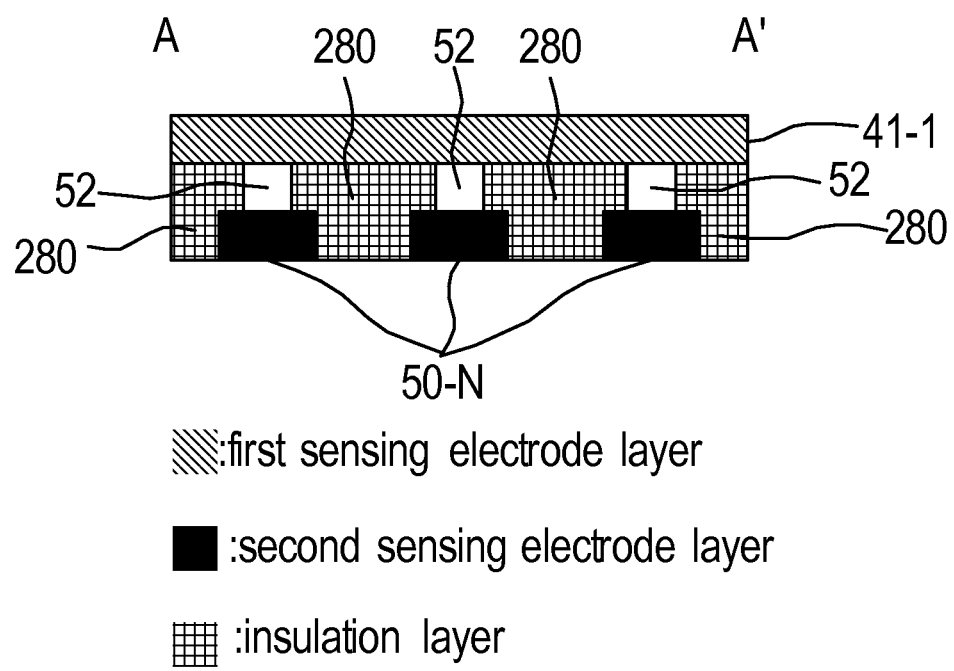
FIG. 5 is a cross sectional view taking along A-A' line of FIG. 4.

FIG. 5 is a cross sectional view taking along A-A' line of FIG. 4. As shown in FIG. 5, the second conductor line unit 50-N is connected with the connection line 41-1 at the position denoted by the dotted ellipse B of FIG. 4. With reference to FIGS. 2 and 5, the first insulation layer 280 is arranged between the first sensing electrode layer 250 and the second sensing electrode layer 260, and the second conductor line unit 50-N is electrically connected to the connection line 41-1 through a via 52 that passes through the first insulation layer 280. That is, with the connection line 41-1, the second conductor line unit 50-N is able to transmit the sensed signal to the control circuit 610.

Figure 6:
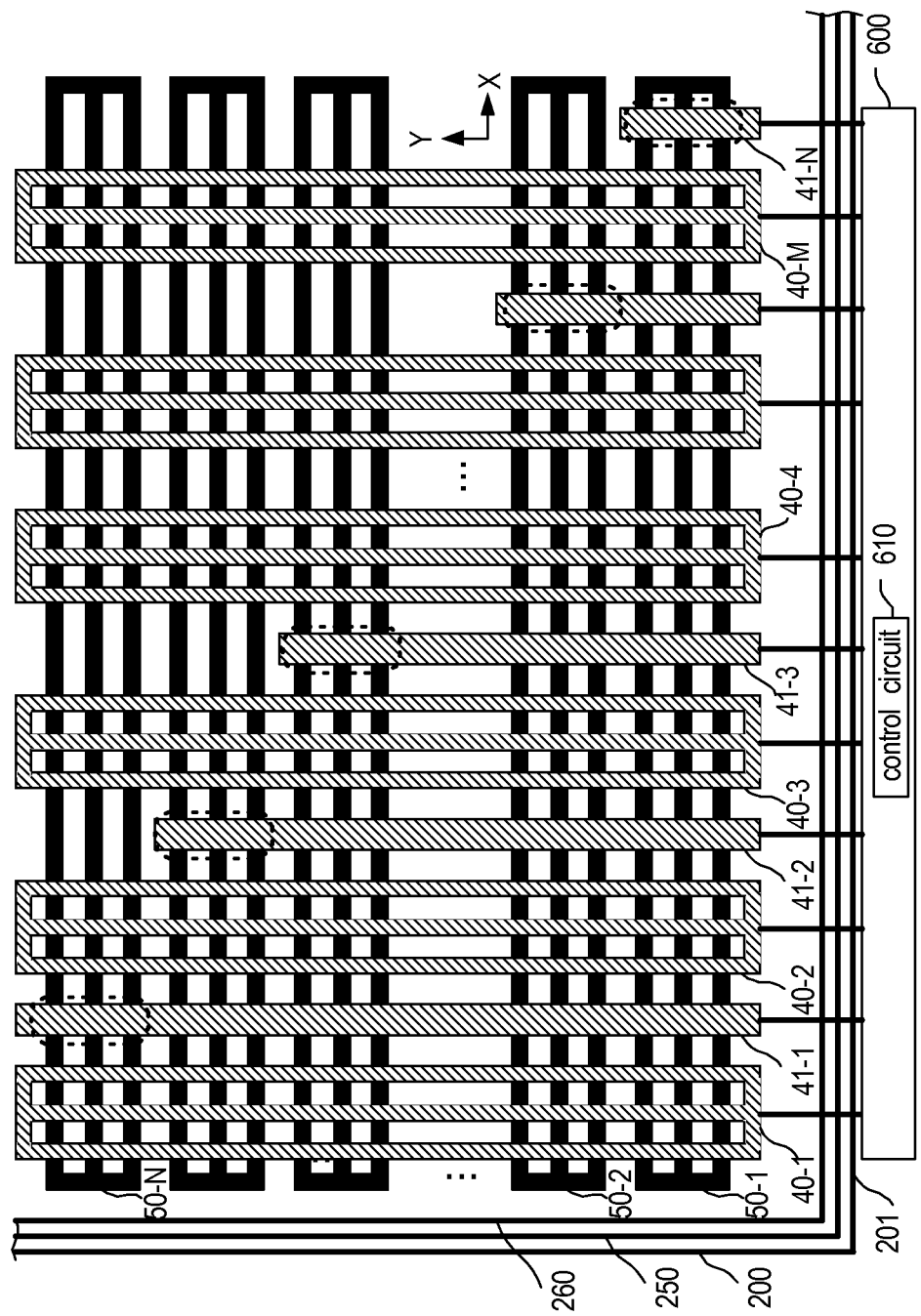
FIG. 6 is another schematic diagram of the in-cell OLED touch panel structure of narrow border according to the present invention.

FIG. 6 is another schematic diagram of the in-cell OLED touch panel structure of narrow border 200 according to the invention, which is similar to FIG. 4 except that the N connection lines 41-1, 41-2, ..., 41-N have different lengths. As shown, the lengths of the N connection lines 41-1, 41-2, ..., 41-N are gradually decreased in this embodiment.

Figure 7:
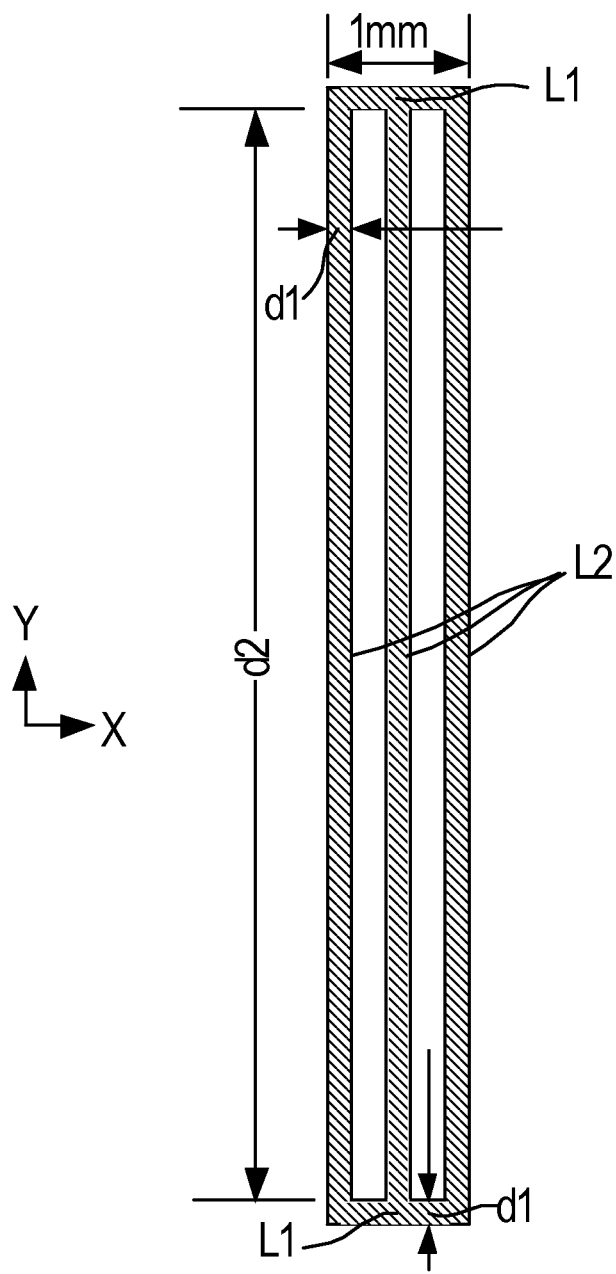
FIG. 7 is a schematic diagram of a first conductor line unit.

FIG. 7 is a schematic diagram of a first conductor line unit (40-1, 40-2, ..., 40-M). As shown, the quadrilateral region is a rectangle composed of three metal sensing lines L2 in the first direction and two metal sensing lines L1 in a second direction. In other embodiments, the number of metal sensing lines can be varied according to the actual requirement.

The line width of the metal sensing line L1 or L2 is preferred to be smaller than or equal to the line width of each opaque line 241 of the black matrix layer 240. The M first conductor line units 40-1, 40-2, . . . , 40-M, the N connection lines 41-1, 41-2, . . . , 41-N, and the N second conductor line units 50-1, 50-2, . . . , 50-N are disposed at positions corresponding to the positions of the plurality of opaque lines 241 of the black matrix layer 240. Therefore, when viewing from the upper substrate 210 to the lower substrate 220, the M first conductor line units 40-1, 40-2, . . . , 40-M, the N connection lines 41-1, 41-2, . . . , 41-N, and the N second conductor line units 50-1, 50-2, . . . , 50-N are disposed at positions right below the positions of the plurality of opaque lines 241, and thus can be concealed by the plurality of opaque lines 241, so that users only see the plurality of opaque lines 241 but not the M first conductor line units 40-1, 40-2, . . . , 40-M, the N connection lines 41-1, 41-2, . . . , 41-N, and the N second conductor line units 50-1, 50-2, . . . , 50-N. Accordingly the light penetration rate will not be influenced.

The color filter layer 270 is disposed at one side of the black matrix layer 240 that faces the OLED layer 230.

The first insulation layer 280 is disposed on the surface of the color filter layer 270.

The thin film transistor layer 300 is disposed at one side of the lower substrate 220 that faces the OLED layer 230. The thin film transistor layer 300 includes K gate lines and L source lines, wherein K and L are positive integers. The gate lines and source lines are well-known to those skilled in the art of display panel, and thus are not shown in the figures. Based on a display pixel signal and a display driving signal, corresponding pixel transistor and pixel capacitor are driven so as to proceed with display operation. The K gate lines and the L source lines are disposed at positions corresponding to the positions of the plurality of opaque lines 241.

In addition to the gate lines and source lines, the thin film transistor layer 300 further includes a plurality of pixel driving circuits 301. Based on a display pixel signal and a display driving signal, the thin film transistor layer 300 drives a corresponding pixel driving circuit 301 so as to proceed with display operation.

According to different designs of the pixel driving circuit 301, such as 2T1C being a pixel driving circuit formed with two thin film transistors and a storage capacitor, and 6T2C being a pixel driving circuit formed with six thin film transistors and two storage capacitors. The gate 3011 of at least one thin film transistor in the pixel driving circuit 301 is connected to a gate line (not shown). According to different designs of driving circuit, a source/drain 3013 of at least one thin film transistor in a control circuit is connected to a source line (not shown) and a source/drain 3015 of at least one thin film transistor in pixel driving circuit 301 is connected to a corresponding anode pixel electrode 311 of the anode layer 310.

The cathode layer 290 is disposed at one side of the upper substrate 210 facing the OLED layer 230 and between the upper substrate 210 and the OLED layer 230. There is a second insulation layer 320 arranged between the cathode layer 290 and the second sensing electrode layer 260. The cathode layer 290 is made of conductive metal material, preferably metal material with thickness being less than 50 nm. The metal material is selectively to be aluminum, silver, magnesium, calcium, potassium, lithium, indium, their alloy, or combination of lithium fluoride, magnesium fluoride, lithium oxide and aluminum. Due to the thickness of the cathode layer 290 being less than 50 nm, the light generated by the OLED layer 230 can pass through it, so as to show images on the upper substrate 210. The cathode layer 290 is intact piece electrical connection, so that it can be used as a shielding. Moreover, the cathode layer 290 also receives the current coming from the anode pixel electrode 311.

The anode layer 310 is disposed at one side of the thin film transistor layer 300 facing the OLED layer 230. The anode layer 310 includes a plurality of anode pixel electrodes 311. Each of the anode pixel electrodes 311 is corresponding to one pixel driving transistor of the pixel driving circuit 301 of the thin film transistor layer 300. That is, each of the anode pixel electrodes is connected to a source/drain 3015 of the pixel driving transistor of the corresponding pixel driving circuit 301, so as to form a pixel electrode of a specific color, for example a red pixel electrode, a green pixel electrode, a blue pixel electrode, or a white pixel electrode which is adopted in the present invention.

The OLED layer 230 includes a hole transporting layer 231, an emitting layer 233, and an electron transporting layer 235. The OLED layer 230 preferably emits white light, and uses the color filter layer 270 to filter out and generate red, blue, green primary colors.

Figure 8:
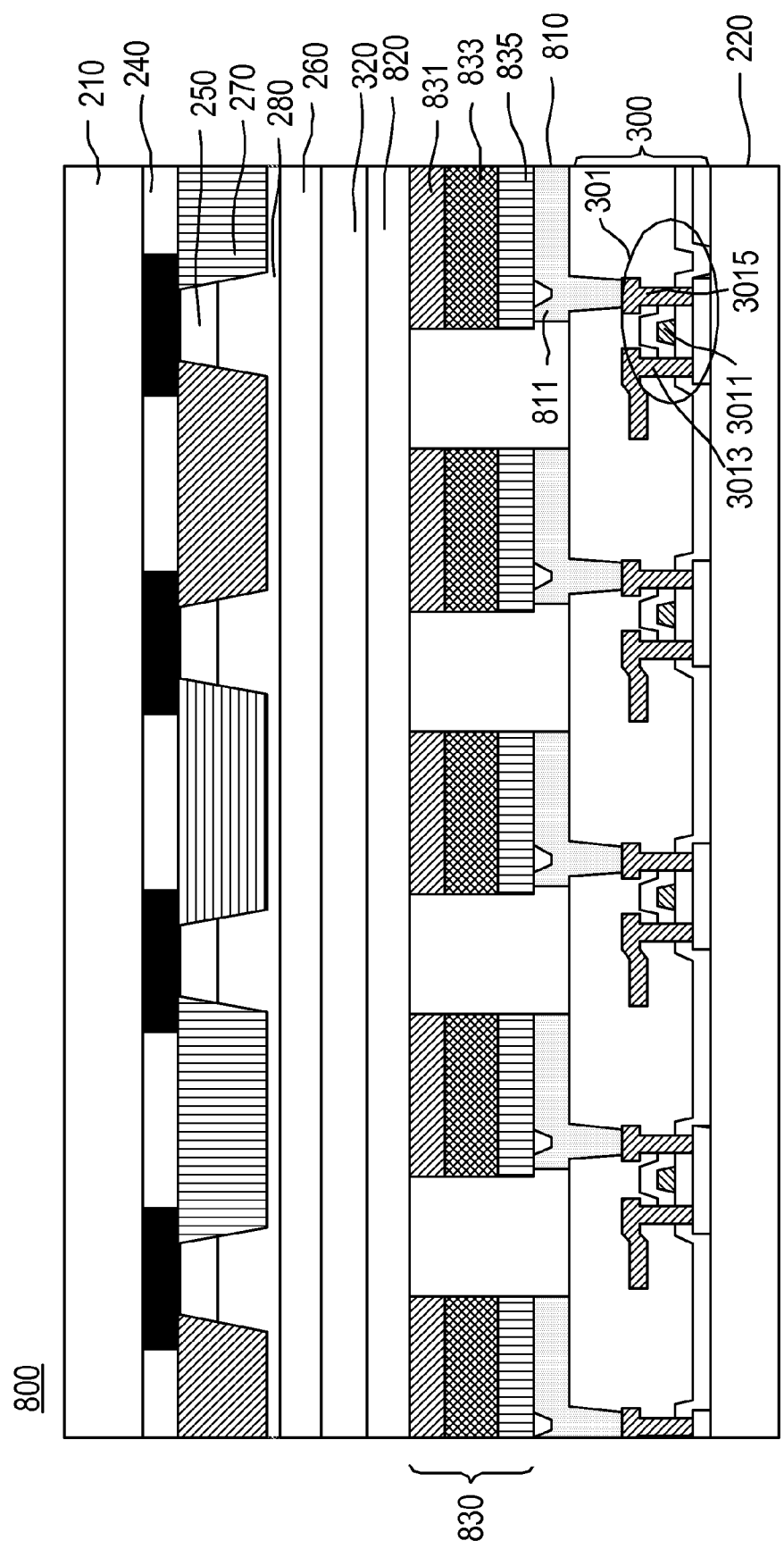
FIG. 8 is a stack diagram of an in-cell OLED touch display panel structure of narrow border in accordance with another embodiment of the present invention.

FIG. 8 is a stack diagram of an in-cell OLED touch display panel structure of narrow border 800 in accordance with another embodiment of the present invention, which is similar to the in-cell OLED touch display panel structure of FIG. 2 except that the positions of the cathode layer 810 and the anode layer 820 are exchanged to each other. The cathode layer 810 includes a plurality of cathode pixel electrodes 811. Each of the cathode pixel electrodes 811 is corresponding to one pixel driving transistor of the pixel driving circuit 301 of the thin film transistor layer 300. That is, each of the cathode pixel electrodes is connected to a source/drain 3015 of the pixel driving transistor of the corresponding pixel driving circuit 301, so as to form a pixel electrode of a specific color, for example a red pixel electrode, a green pixel electrode, a blue pixel electrode, or a white pixel electrode adopted in the present invention.

As shown in FIG. 8, the positions of the cathode layer 810 and the anode layer 820 are exchanged to each other. In order to match with the positions of cathode layer 810 and the anode layer 820, the positions of the hole transporting layer 831 and the electron transporting layer 835 are also exchanged to each other. The cathode layer 810 includes a plurality of cathode pixel electrodes 811. Each of the cathode pixel electrodes 811 is connected to a source/drain of the pixel driving transistor of the corresponding pixel driving circuit.

In the prior art, the electrode pads made of ITO have an average light penetration rate of about 90%. In the present invention, the M first conductor line units 40-1, 40-2, . . . , 40-M, the N connection lines 41-1, 41-2, . . . , 41-N, and the N second conductor line units 50-1, 50-2, . . . , 50-N are disposed at positions below the positions of the plurality of opaque lines 241, so that the light penetration rate is not influenced. Therefore, the light penetration rate of the present invention is much better than that of the prior art. Accordingly, in comparison with the prior touch display panel, the in-cell OLED touch display panel structure in accordance with the present invention shall have a higher brightness.

Figure 1:
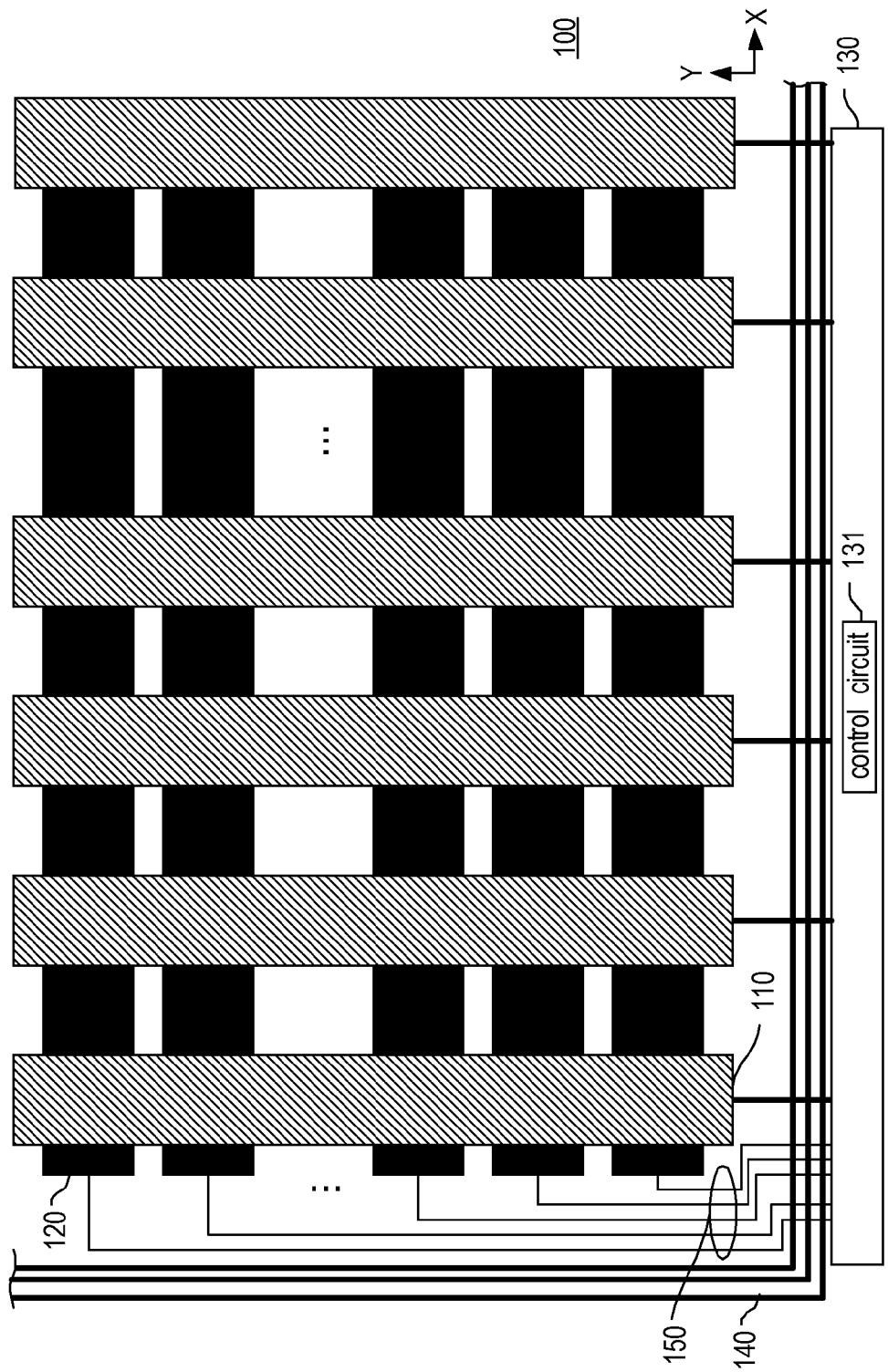
FIG. 1 is a schematic diagram of a prior touch panel structure.

In view of the forgoing, it is known that the prior art, as shown in FIG. 1, will increase the border width of touch display panel and thus is not suitable for the trend of narrow border design. On the contrary, the present invention not only is suitable for narrow border design but also provides a higher brightness.

Moreover, in the present invention, the M first conductor line units 40-1, 40-2, . . . , 40-M, the N second conductor line units 50-1, 50-2, . . . , 50-N and the N connection lines 41-1, 41-2, . . . , 41-N are all made of metal material, which has a better conductivity in comparison with the prior art, so as to easily transmit the sensed signals of the connection lines to the control circuit, thereby allowing the control circuit to accurately compute the touch coordinates. Accordingly, it is known that the present invention has a better light penetration rate in comparison with the prior art and can lower the manufacturing cost by avoiding the use of expensive ITO material, which is suitable for the touch display panel of narrow border.

Although the present invention has been explained in relation to its preferred embodiment, it is to be understood that many other possible modifications and variations can be made without departing from the spirit and scope of the invention as hereinafter claimed.

What is claimed is:

1. An in-cell OLED touch panel structure of narrow border, comprising:
    an upper substrate;
    a lower substrate parallel to the upper substrate;
    an OLED layer configured between the upper substrate and the lower substrates;
    a black matrix layer arranged on one side of the upper substrate facing the OLED layer, the black matrix layer being composed of a plurality of opaque lines;
    a first sensing electrode layer arranged on one side of the black matrix layer facing the OLED layer and including M first conductor line units and N connection lines arranged in a first direction for touch detection, where M and N are each a positive integer;
    a second sensing electrode layer arranged on one side of the first sensing electrode layer facing the OLED layer and including N second conductor line units arranged in a second direction for touch detection, wherein each of the N second conductor line units makes use of a corresponding i-th connection line to be extended to one edge of the in-cell OLED touch panel structure, where i is a positive integer and 1≤i≤N; and
    a thin film transistor layer disposed at one side of the lower substrate facing the OLED layer,
    wherein the M first conductor line units, the N connection lines, and the N second conductor line units are disposed at positions corresponding to those of the plurality of opaque lines of the black matrix layer,
    wherein each of the M first conductor line units is extended to the same edge of the panel structure through a corresponding metal wire for being further connected to a flexible circuit board.

2. The in-cell OLED touch panel structure of narrow border as claimed in claim 1 wherein the N connection lines are made of conductive metal material.

3. The in-cell OLED touch panel structure of narrow border as claimed in claim 2, wherein each of the M first conductor line units is composed of plural metal sensing lines, and each of the N second conductor line units is composed of plural metal sensing lines.

4. The in-cell OLED touch panel structure of narrow border as claimed in claim 3, wherein the plural metal sensing lines of each of the M first conductor line units form a quadrilateral region, and the plural metal sensing lines of each of the N second conductor line units form a quadrilateral region, such that the metal sensing lines in each quadrilateral region are electrically connected together, while any two of the quadrilateral regions are not connected with each other.

5. The in-cell OLED touch panel structure of narrow border as claimed in claim 4, wherein the first direction is substantially perpendicular to the second direction.

6. The in-cell OLED touch panel structure of narrow border as claimed in claim 5, wherein each of the N connection lines is disposed between two first conductor line units.

7. The in-cell OLED touch panel structure of narrow border as claimed in claim 6, wherein the quadrilateral region has a shape of rectangle or square.

8. The in-cell OLED touch panel structure of narrow border as claimed in claim 7, wherein the metal sensing lines in each quadrilateral region formed by the plural metal sensing lines of each of the M first conductor line units and the N second conductor line units are made of conductive metal material or alloy material.

9. The in-cell OLED touch panel structure of narrow border as claimed in claim 8, wherein the conductive metal material is chromium, barium, aluminum, silver, copper, titanium, nickel, tantalum, cobalt, tungsten, magnesium, calcium, potassium, lithium, indium, their alloy, or a mixture of LiF, MgF2 or Li2O.

10. The in-cell OLED touch panel structure of narrow border as claimed in claim 9, wherein the thin film transistor layer further includes K gate lines and L source lines for driving corresponding pixel transistor and pixel capacitor based on a display pixel signal and a display driving signal, so as to perform a display operation, where K and L are each a positive integer.

11. The in-cell OLED touch display panel structure of narrow border as claimed in claim 10, wherein the K gate lines and the L source lines are disposed at positions corresponding to those of the plurality of opaque lines of the black matrix layer.

12. The in-cell OLED touch display panel structure of narrow border as claimed in claim 9, further comprising:
    a color filter layer disposed at one side of the black matrix layer and facing the OLED layer; and
    a first insulation layer disposed on a surface of the color filter.

13. The in-cell OLED touch display panel structure of narrow border as claimed in claim 12, further comprising:
    a cathode layer disposed at one side of the second sensing electrode layer facing the OLED layer; and
    an anode layer disposed at one side of the thin film transistor layer facing the OLED layer, the anode layer including a plurality of anode pixel electrodes, each of the anode pixel electrodes being connected to a source/drain of the pixel driving transistor of a corresponding pixel driving transistor.

14. The in-cell OLED touch display panel structure of narrow border as claimed in claim 12, further comprising:
    a cathode layer disposed at one side of the thin film transistor layer facing the OLED layer, the cathode layer including a plurality of cathode pixel electrodes, each of the cathode pixel electrodes being connected to a source/drain of the pixel driving transistor of a corresponding pixel driving transistor; and
    an anode layer disposed at one side of the second sensing electrode layer facing the OLED layer.

* * * * *